United States Patent [19]
Takahashi

[11] 3,946,330
[45] Mar. 23, 1976

[54] VOLTAGE CONTROLLED OSCILLATOR CIRCUIT

[75] Inventor: Nobuaki Takahashi, Yamato, Japan

[73] Assignee: Victor Company of Japan, Ltd., Yokohama, Japan

[22] Filed: Mar. 25, 1975

[21] Appl. No.: 561,672

[30] Foreign Application Priority Data
Apr. 8, 1974 Japan.............................. 49-39901

[52] U.S. Cl. .................. 331/8; 331/27; 331/108 D; 331/111; 331/113 R
[51] Int. Cl.² ..................................... H03K 3/282
[58] Field of Search .......... 331/8, 108 D, 111, 113, 331/27

[56] References Cited
UNITED STATES PATENTS

| | | | |
|---|---|---|---|
| 3,582,809 | 6/1971 | Rigby | 331/8 |
| 3,665,343 | 5/1972 | Thompson | 331/113 R |
| 3,688,213 | 8/1972 | Calaway | 331/113 R |
| 3,794,934 | 2/1974 | Rhee | 331/111 |
| 3,811,097 | 5/1974 | Jijkmans | 331/113 |
| 3,815,052 | 6/1974 | Watatani | 331/108 |
| 3,870,971 | 3/1975 | Takahashi et al. | 331/108 D |
| 3,886,485 | 5/1975 | Takahashi | 331/108 D |

*Primary Examiner*—John Kominski

[57] ABSTRACT

A voltage controlled oscillator circuit comprises a voltage controlled oscillator circuit, first and second constant-current circuits respectively for causing first and second constant currents, current dividing means for dividing the first constant current in accordance with an outside control voltage, and means for adjustably varying the control voltage. The oscillation frequency is controlled responsive to an input control current equal to the sum of one of the divided currents and the second constant current. The adjustment means causes an adjustment of the output currents of the current dividing means and of the free-running oscillation frequency.

6 Claims, 5 Drawing Figures

VOLTAGE CONTROLLED OSCILLATOR CIRCUIT

BACKGROUND OF THE INVENTION

This invention relates to new and improved voltage controlled oscillator circuits and more particularly to means for supplying the oscillation output signal to a phase comparator in a phase locked loop, especially-although not exclusively for demodulation of angle-modulated waves.

In general, a voltage controlled oscillator (hereinafter referred to as a VCO) for use in a phase locked loop (hereinafter referred to as a PLL) is required to possess desirable properties, such as a linear relationship between an outside control voltage and the output frequency. The VCO should also have equal duty cycles in its output oscillation waveform.

Furthermore, if a VCO is to be incorporated in a monolithic integrated circuit (IC), the VCO is required to have characteristics such as an output voltage which is not extremely high and an output waveform which does not contain a large quantity of harmonic components. That is, not the waveform should have a sharp-cornered rectangular form, but should have rounded-off corners. These rounded corners prevent the VCO output from imposing interference on other circuits within the same IC chip.

A further requirement, if the VCO is to be incorporated in a monolithic IC, the the current consumed from the +B power source should be unvarying, with respect to the oscillation output, in order to prevent the oscillation current of the VCO from affecting other circuits via the power supply circuit.

A novel voltage controlled oscillator, which satisfies the above stated requirements, is described in U.S. patent application Ser. No. 417,475, filed on Nov. 19, 1973, and entitled "Circuit arrangement of voltage controlled oscillator", now U.S. Pat. No. 3,886,485.

A so-called discrete four-channel record disc, which has been described in U.S. Pat. No. 3,686,471, is at present being widely used. In the process of recording on this disc, a direct wave of a sum signal of two of the channels and an angle modulated wave obtained by angle modulating a carrier wave of 30 KHz by means of a difference signal of two of the channels are multiplexed and recorded on the left and right walls of the disc sound groove. For the demodulation of the angle modulated wave reproduced from this four-channel record disc, a PLL circuit is generally used.

Next to be considered is the effect which occurs when a reproducing (playing) pickup stylus is placed on a stopped discrete four-channel record disc, which is then starting to rotate. In this case, the record disc starts rotating from its stopped position and gradually increases its rotational speed until, after a specific time, it reaches a constant rotational speed. Since the pickup stylus is riding on the record disc during this period of less than normal speed, a previously recorded signal is being reproduced during this period.

This reproduced signal is at a lower frequency than the normal frequency. Consequently, erroneous locking with respect also to a signal of a frequency of the order a fraction of the carrier wave frequency, for example, tends to occur in the PLL circuit. This mis-locking causes noise.

Accordingly, the generation of this noise can be prevented by previously preventing the oscillation frequency of the voltage controlled oscillator from decreasing to a value below a certain critical frequency. After the rotational speed becomes close to the normal, the phase of the oscillation signal of the voltage controlled oscillator is locked to the phase of the input angle modulated signal.

This voltage controlled oscillator of U.S. Pat. No. 3,686,471 is so adapted that the oscillation frequency will not become less than a certain critical frequency. However, it is difficult to hold this critical oscillation frequency at a specifically constant value--; for reasons such as deviations in the current amplification of transistors and in the resistance values of the resistors used.

Another voltage controlled oscillator, which adds circuits that solve these problems, is found in the U.S. Pat. No. 3,870,971, entitled "Circuit Arrangement of Voltage Controlled Oscillator".

According to this patent the voltage controlled oscillator responds to a control current having a linearly proportional relationship with the oscillation frequency. Moreover, the oscillation frequency is controlled by the current, which varies within a predetermined range with respect to a specific current as a center. Thus, a critical value of the oscillation frequency is accurately held at a predetermined frequency.

However, in this circuit of U.S. Pat. No. 3,870,971, if the power supply voltage fluctuates, the bias current varies, since it is dependent on the power supply voltage. For example, if the power supply voltage rises, the free-running frequency of the voltage controlled oscillator also increases unavoidably, which has been a problem.

SUMMARY OF THE INVENTION

Accordingly, a general object of the present invention is to provide a novel and useful voltage controlled oscillator which has solved the above mentioned problem.

A specific object of the invention is to provide a voltage controlled oscillator wherein the free-running frequency does not fluctuate responsive to fluctuations of the power supply voltage. Deviations in the free-running frequency, due to errors in the manufacturing processes, can be easily corrected. By using this oscillator as a voltage controlled oscillator of a PLL, the lock range of the PLL can be so adjusted that it is continually symmetrical.

Another object of the invention is to provide a voltage controlled oscillator in which means are provided for varying the output current of the current dividing means. This means is connected between a pair of external control terminals of current dividing means used for driving the voltage controlled oscillator.

Other objects and further features of the invention will be apparent from the following detailed description when read in conjunction with the accompanying drawings.

DETAILED DESCRIPTION

As conducive to a full understanding of the present invention, first to be described, briefly, is the circuit of a previous voltage-controlled oscillator, which has been disclosed in U.S. Pat. No. 3,870,971. A problem relating thereto will also be described.

Figure 1:
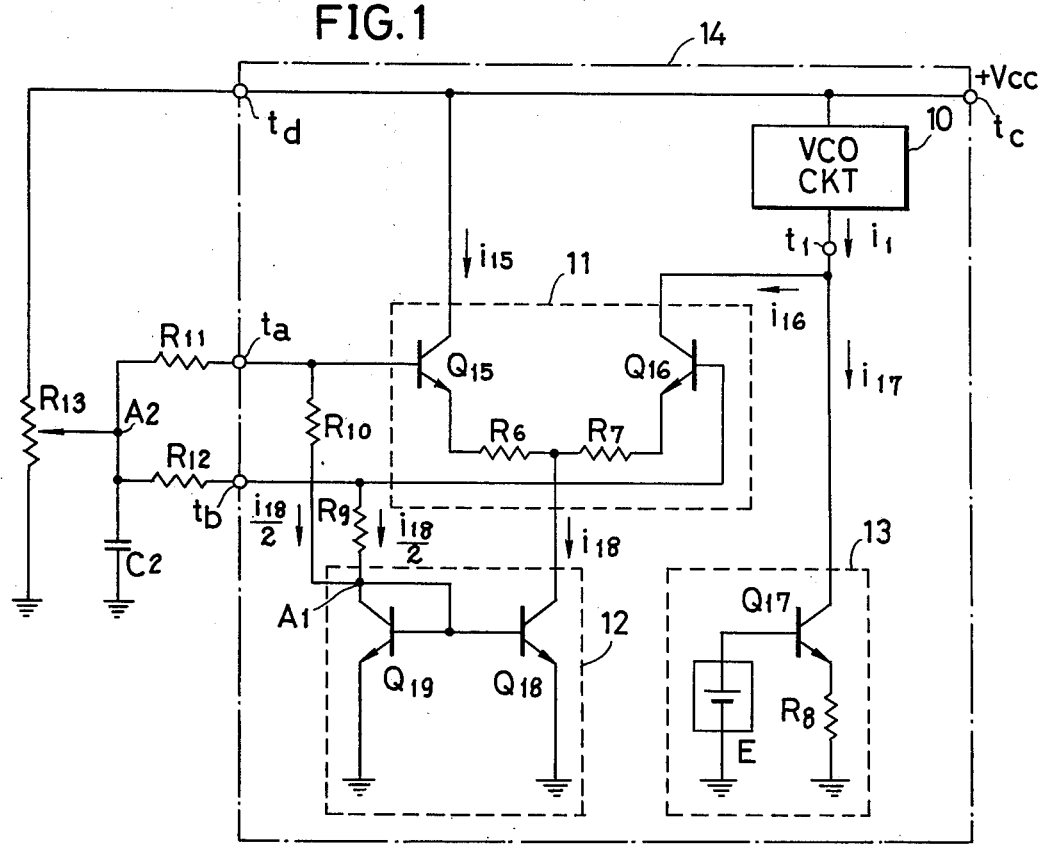
FIG. 1 is a circuit diagram of one example of a prior art voltage controlled oscillator.
Figure 2:
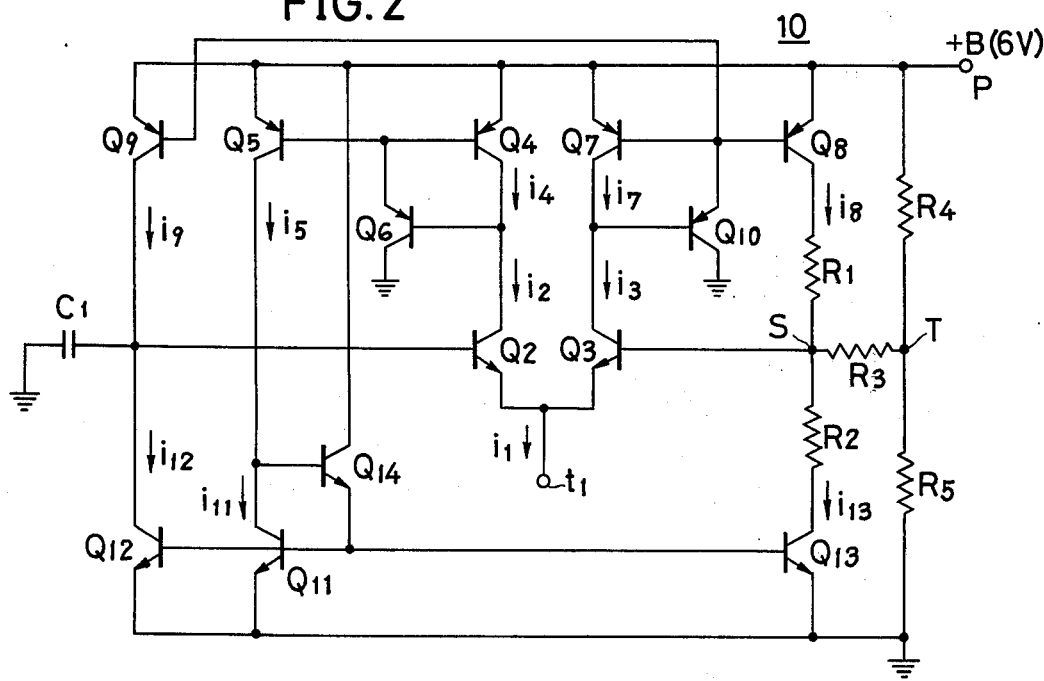
FIG. 2 is a circuit diagram of one example of a voltage controlled oscillator used in the arrangement illustrated in FIG. 1.

In FIG. 1, a voltage controlled oscillator 10 is that which is shown in U.S. Pat. No. 3,870,971. One example of specific circuit is shown in FIG. 2. The voltage controlled oscillator 10 is described with reference to FIG. 2, at first.

The emitters of transistors Q2 and Q3 are connected commonly to each other and to a control terminal t1. A capacitor C1 is connected between the base of the transistor Q2 and ground. If this VCO circuit is to be incorporated in a monolithic IC, together with other circuits, capacitor C1 is connected outside of the IC.

The circuit further has transistors Q4, Q5, and Q6 which constitute a current-mirror circuit. In addition, transistors Q7, Q8, Q9, and Q10 and transistors Q11, Q12, Q13, and Q14 respectively constitute modifications of the current-mirror circuit. In these modified current-mirror circuits, the collector currents are respectively equal among the transistors Q7, and Q8, and Q9 and transistors Q11, Q12, and Q13.

As a consequence of the current i1 to terminal t1, between the transistors Q2 and Q3, the transistor of higher base potential is switched "ON", while that transistor of lower base potential is switched "OFF".

If the transistor Q2 thus switches ON, the current $i1$ at the terminal $t1$, the collector currents $i2$ and $i3$ of the transistors Q2 and Q3 will have the following relationships;

$$i1 = i2,$$

$$i3 = 0$$

Furthermore, as a result of the operation of the currentmirror circuits, the following relationships will be valid between the collector currents $i4$, $i5$, $i11$, $i12$, and $i13$ of the transistors Q4, Q5, Q11, Q12, and Q13.

$$i4 \ ( = i2 \ ) = i5,$$

$$i11 \ ( = i5 \ ) = i12 = i13$$

Accordingly, $i1 = i2 = i4 = i5 = i11 = i12 = i13$.

On the other hand, the currents $i3$, $i7$, $i8$, and, $i9$ of the transistors Q3, Q7, Q8, and Q9 will all be zero.

Therefore, when the transistor Q2 is ON, and the transistor Q3 is OFF, a discharge current $i12$ flows from the capacitor C1, and the current $i1$ flows to the terminal $t1$.

Conversely, when the transistor Q2 is OFF, and the transistor Q3 is ON:

$$i1 = i3 = i7 = i9,$$

$$i2 = i5 = i12 = 0$$

Therefore, in this case, a charging current $i9$ flows to the capacitor C1.

As a result, a discharging current $i12$ ( $= i1$ ) and a charging current $i9$ ( $= i1$ ) flow alternately in the capacitor C1 in accordance with the alternate ON and OFF states of the transistors Q2 and Q3.

The potential of the point S, connected to the base of the transistor Q3, will be considered. For this purpose, it will be assumed that the resistance values of the above mentioned resistors R1 through R5 have been selected, as follows:

$$R1 = R2 = 25 \ K\Omega, R3 = 5 \ K\Omega, R4 = R5 = 1.5 \ K\Omega$$

The potential of the junction point T is the result of a division of the potential of +B (6V), by the resistors R4 and R5 (where, R4 = R5). That is, the potential at point T is ½ of 6V or 3V.

Then, when the transistor Q2 is ON, and the transistor Q3 is OFF, the current-mirror circuit of the transistors Q11, Q12, and Q13 tends to cause currents $i11 = i13 = i1$. However, since the potential at the point T is 3V, even in the case where $i1 = 200 \ \mu A$, $200 \ \mu A$ does not flow as the current $i13$. Instead a current $i13$ has the following value:

$$i13 = \frac{3}{(25 + 5) \times 10^3} = 100 \ (\mu A)$$

Since the current flows from the point T toward the point S, at this time, the potential at the point S becomes $$3 - (5 \times 10^3 \times 100 \times 10^{-6}) = 2.5 \ V.$$

Therefore, even if the current $i1$ is higher than 100 $\mu A$, the potential of the point S will become constant. At this time $i8 = 0$.

Similarly, when the transistor Q3 is ON, the current $i13$ is zero, and the current $i8$ becomes 100 $\mu A$. Then since the current flows from the point S toward the point , , the potential of the point S becomes $$3 + (5 \times 10^3 \times 100 \times 10^{-6}) = 3.5 \ V.$$

Thus, when the transistor Q3 is OFF, its base potential becomes 2.5 V; whereas when it is ON, its base potential becomes 3.5 V. Furthermore, as mentioned above, a discharging current of $i12 = i1$ flows from the capacitor C1 when the transistor Q3 is OFF. A charging current of $i9 = i1$ flows thereto when the transistor Q3 is ON.

Figure 3:
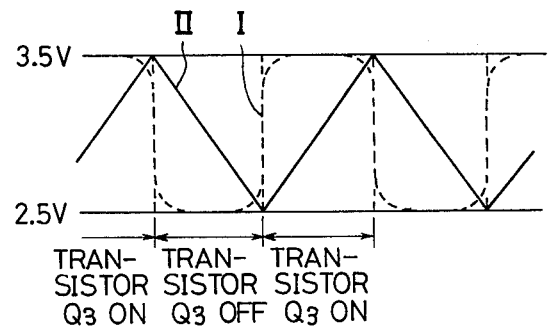
FIG. 3 is a graph indicating the waveform of the base voltage of a transistor, which graph is useful for a description of the manner in which the voltage controlled oscillation shown in FIG. 2 oscillates.

This operational feature is indicated in FIG. 3. In this figure, the rectangular wave, shown by the broken line I represents the base potentials of the transistor Q3 resulting from the ON and OFF states of the transistor Q3. That is, this wave shows the variation of the potential at the point S. This potential is indicated as being 3.5 V when the transistor Q3 is ON and 2.5 V when the transistor Q3 is OFF.

Then, as mentioned above, a charging current of $i9 = i1$ flows in the capacitor C1 when the transistor Q3 is ON. At this time, the potential at the junction point between the base of the transistor Q2 and the capacitor C1 rises with a gradient determined by the current $i9$ ( $= i1$ ) and the capacitance of the capacitor C1. Then, when the base potential of the transistor Q2 rises in this manner and reaches a value higher than 3.5 V, the transistor Q2 switches ON, while the transistor Q3 switches OFF.

When the transistor Q3 is OFF, its base potential becomes 2.5 V, and a discharging current $i12 = i1$ flows from the capacitor C1. As a result, the base potential of the transistor Q2 decreases gradually with a gradient which is the reverse of the above mentioned rise. Then, when this base potential of the transistor Q2 becomes less than 2.5 V, the transistor Q2 switches OFF, and the transistor Q3 switches ON, whereby the state of the circuit is inverted.

The above described variations of the base potential of the transistor Q2 is indicated by a full line or solid line II in FIG. 3. Since, the charging and discharging currents $i9$ and $i12$ are equal in this case, the duty cycles of the ON and OFF states of the transistors Q2 and Q3 are equal, These duty cycles are ½, that is, 50 percent.

Thus, the VCO continues with an oscillation output of a duty cycle of 50 percent. The oscillation frequency is determined by the current $i1$ ( $= i9 = i12$ ) and the capacitance of the capacitor C1. Here, the current $i1$ and the oscillation frequency have a linear, proportional relationship.

The collector currents of the transistors Q8 and Q13 flow through the resistors R1 and R2, of high resistance value of 25 KΩ. Furthermore, there are capacitance components between the base and emitter and between the base and collector of the transistor Q3. For this reason, the response speed of the variation of the base voltage of the transistor Q3 becomes slow, and the waveform of this base voltage becomes a rectangular wave with dull, rounded corners, between its rising and falling edges as indicated by the broken line I in FIG. 3.

In this connection, the fact that the corners of a rectangular wave are sharp means that it contains many harmonic components, whereas roundness of the corners of a rectangular wave means that an oscillation output can be obtained with few harmonic components, as the output of the VCO.

The oscillation output of the VCO itself is led out through the points S and T and supplied to a phase comparator (not shown) of the PLL.

The output voltage from the voltage controlled oscillator circuit is held at the sum of the forward diode voltages ( 0.7 V ) between the bases and emitters of two silicon transistors (e.g., Q4 and Q6), that is, at a value of 1.4 Vp-p as a maximum. Therefore, when the above described circuit is incorporated within a monolithic IC, together with another circuit, its oscillation output does not have a deleterious effect on the other circuit.

When the current corresponds to a frequency of 30 KHz is 200 μA, the values of the above mentioned collector currents $i8$ and $i13$ are determined by the lower limiting frequency of the above mentioned lock range characteristic. For example, if the limiting frequency of the lock range is 15 KHz, the currents $i8$ and $i13$ are selected at 100 μA.

Returning to the circuit illustrated in FIG. 1, the previously proposed circuit of the voltage controlled oscillator, according to the invention, is consituted by the addition of a differential amplifier circuit 11 and constant current circuits 12 and 13, which are added to the voltage controlled oscillator 10.

The differential amplifier 11 comprises a pair of transistors Q15 and Q16 having emitters, which are connected together through resistors R6 and R7. To the bases of these transistors Q15 and Q16 are connected terminals $ta$ and $tb$, to which external control voltages are applied. The collector of the transistor Q15 is connected to a ×Vcc power supply terminal, while the collector of the transistor Q16 is connected to a terminal $t1$ of the voltage controlled oscillator 10. This differential amplifier 11 is driven by the first constant-current circuit 12.

This first constant-current circuit 12 consists of a current mirror circuit 20 comprising transistors Q18 and Q19, having grounded emitters. The collector of the transistor Q18 is connected to a junction point between the resistors R6 and R7. The collector of the transistor Q19 is connected by way of a resistor R9 to the terminal $tb$. The bases of the transistors Q18 and Q19 are connected commonly to the collector of the transistor Q19 and, at the same time, by way of a resistor R10 to the terminal $ta$.

The second constant-current circuit 13 comprises a transistor Q17 having a base which is connected to the bias power supply E. Its emitter is grounded through a resistor R8. The collector of transistor Q17 is connected to terminal $t1$ of the voltage controlled oscillator 10.

An integrated circuit 14, enclosed within a dash single-dot chain line rectangle, contains the voltage controlled oscillator 10, differential amplifier circuit 11, constant current circuit 12 and 13, resistors R9 and R10, etc. This IC 14 has pins forming the above mentioned terminals $ta$ and $b$ and +Vcc terminals $tc$ and $td$.

To the terminals $ta$ and $tb$ are respectively connected the ends on one side of resistors R11 and R12, the other ends of which are connected to the slidable contact of a variable resistor R13. At the same time, terminals $ta$, $tb$ are grounded by way of a capacitor C2. The variable resistor R13 is connected between the terminal $d$ and ground.

The above mentioned resistors R11 and R12, the variable resistor R13, and capacitor C2 are discrete components which are outside of the IC 14.

When the current amplification factor $H_{fe}$ of the transistors Q15 and Q16 is assumed to be amply large, and the base currents thereof are assumed to be negligibly small, the relationship is $i18 = i15 = i16$ (where $i15$, $i16$ and $i18$ denote the collector currents of the transistors Q15, Q16, and Q18). Furthermore, when the resistance values $r6$ and $r7$ of the resistors R6 and R7 are equal ($r6 = r7$), and when the control voltage applied across the terminals $ta$ and $tb$ is zero, the relationship is $i15 = i16$, and $i16 = i18/2$.

When the potential of the terminal ta becomes higher than the potential of the terminal $tb$, the collector current $i15$ of the transistor Q15 increases accordingly. The collector current $i16$ of the transistor Q16 decreases. Conversely, when the potential of the terminal ta becomes lower than the potential of the terminal $tb$, the currents $i15$ and $i16$ decrease and increase, respectively. The collector current $i16$ of the transistor Q16 thus varies in accordance with the control voltage in the range from zero to $i18$. Therefore, this collector current $i16$ can be expressed by the following equation:

$$i16 = \frac{i18}{2} \pm \frac{i18}{2}$$

On one hand, the collector current $i17$ of the transistor Q17 can be expressed by the following equation:

$$i17 = k \cdot i18,$$

where $k$ is constant.

Therefore, the control current $i1$ of the voltage controlled oscillator circuit part 10 is as follows:

$$i1 = i16 + i17.$$

Therefore, $$i = k \cdot i18 + i18/2 \pm i18/2$$

Figure 4:
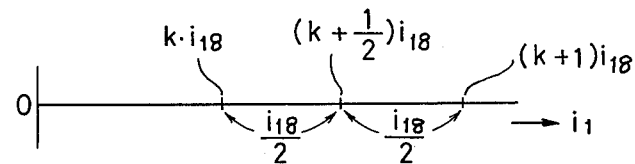
FIG. 4 is a diagram indicating current ranges, which diagram is useful for a description of the circuit arrangement of the invention.

FIG. 4 indicates the range of variation of the above expressed control current $i1$. As is apparent from this diagram, the voltage controlled oscillator 10 is controlled by a current which varies in a range of $\pm i18/2$, with a current of $(k + 1/2) \cdot i18$ as a center.

Accordingly, the frequency of the oscillator 10 is limited within a range $(f0 \pm f1)$. The frequency $f0$ is the produced by the voltage controlled oscillator 10, corresponding to a current of $(k + 1/2) \cdot i18$. The frequency $f1$ is the output of the voltage controlled oscillator 10, corresponding to a current of $i18/2$. The output of the voltage controlled oscillator 10, thus limited, cannot become higher than the frequency $(f0 + f1)$ and cannot become lower than the frequency $(f0 - f1)$.

Then, if the voltage controlled oscillator is used in a phase-locked loop (PLL), the PLL does not operate in response to an input signal having a frequency lower than the frequency $(f0 - f1)$ or higher than the frequency $(f0 + f1)$. For this reason, when these frequencies are so set that $f0 = 30$ KHz and $f1 = 15$ KHz, for example, the PLL acquires a lock range of $(30 \pm 15)$ KHz.

In the discrete system multichannel record disc reproducing apparatus, for example, the rotation of the record disc may start while the pickup is resting on the stopped record disc. A lower than normal carrier frequency may be reproduced. For example, 1/5 or 6 KHz, or ⅓ or 10 KHz, of the carrier wave frequency of 30 KHz, of the angle modulated wave, is reproduced during the time period before the disc rotational speed reaches a constant and normal speed. For a conventional PLL, there might be an erroneous locking to these lower than normal frequencies and result in a generation of noise.

A PLL using the inventive voltage controlled oscillator has a lock range set at $(30 \pm 15)$ KHz, as described above. There is no possibility of an erroneous locking of the PLL to frequency components, such as the above mentioned 6 KHz and 10 KHz. Therefore, noise is not generated.

Thus, in the above described voltage controlled oscillator, the control current and the oscillation frequency have a linearly proportional relationship. This frequency is controlled responsive to the control current, which varies within a specific range having a center frequency at a specific current. Accordingly, the critical value of the oscillation frequency can be held accurately and positively at a specific frequency value.

The resistors R9, R10, R11, and R12 constitute a bridge circuit. Accordingly, when the resistance values $r9$ through $r12$, of these resistors R9 through R12, are so selected that $r9 = r10$ and $r11 = r12$, the bridge circuit reaches a state of equilibrium. The potential difference between the terminals ta and tb will not vary even if the voltage does vary, as measured between the junction point A1 between the resistors R9 and R10 and the junction point A2 between the resistors R11 and R12. Conversely, a variation in the voltage between the terminals ta and tb will not cause a variation in the potential difference between the junction points A1 and A2. When the frequency control signal applied across the terminals ta and tb is zero, the value of the variable resistor R13 is varied. This zero state occurs when the collector currents $i15$ and $i16$ of the transistors Q15 and Q16 have the relationship $i15 = i16 = i18/2$. Since the voltage between the points A1 and A2 varies, it is possible to vary the values of the collector current $i18$ of the transistor Q19 (the currents flowing through the resistors R11 and R12 are respectively $i18/2$). The collector current $i18$ of the transistor Q18, as the above described state, is maintained unchanged. Therefore, it is possible to vary also the value of the collector current $i16$ ($i18/2$) of the transistor Q16 and also the value of the current $i1$ ($= i16 + i17$).

Accordingly, by adjusting the resistance value of the variable resistor R13, the current $i17$ can be varied. The oscillation frequency can be adjusted in accordance with this current $i17$ as the above mentioned state of $i15 = i16 = i18/2$ is maintained.

After the variable resistor R13 has been adjusted in this manner, if an external control signal is applied across the terminals ta and tb, the collector current $i16$ of the transistor Q16 can be varied from zero to $i18$, with the potential difference between the junction points A1 and A2 held constant.

Consequently, the current $i1$ varies in a range from $i17$ to $(i17 + i18)$ about a center current value of $(i17 + i18/2)$. By causing the current $i1 = i17 + i18/2$, after adjustment, to correspond to the oscillation center frequency $f0$ and the current $i18/2$ to correspond to the frequency $f1$, a PLL lock range characteristic can be obtained which is symmetrical about a frequency $f0$ of a width $(f0 \pm f1)$.

However, in the above described circuit, if the power supply voltage +Vcc fluctuates (for example, rises) the currents flowing through the resistors R11 and R12 increase. A problem arises since there is an increase in the free-running oscillation frequency of the voltage controlled oscillator.

Furthermore, in the above described circuit, a symmetrical lock range characteristic is obtained by varying the current $i18$. However, in an actual PLL comprising multistage direct connections, adjustment of the voltage controlled oscillator frequency is made more effective by causing the error voltage, produced at the bases of the transistors Q15 and Q16, to be cancelled. The transistors Q15, Q16 form the differential amplifier 11.

Figure 5:
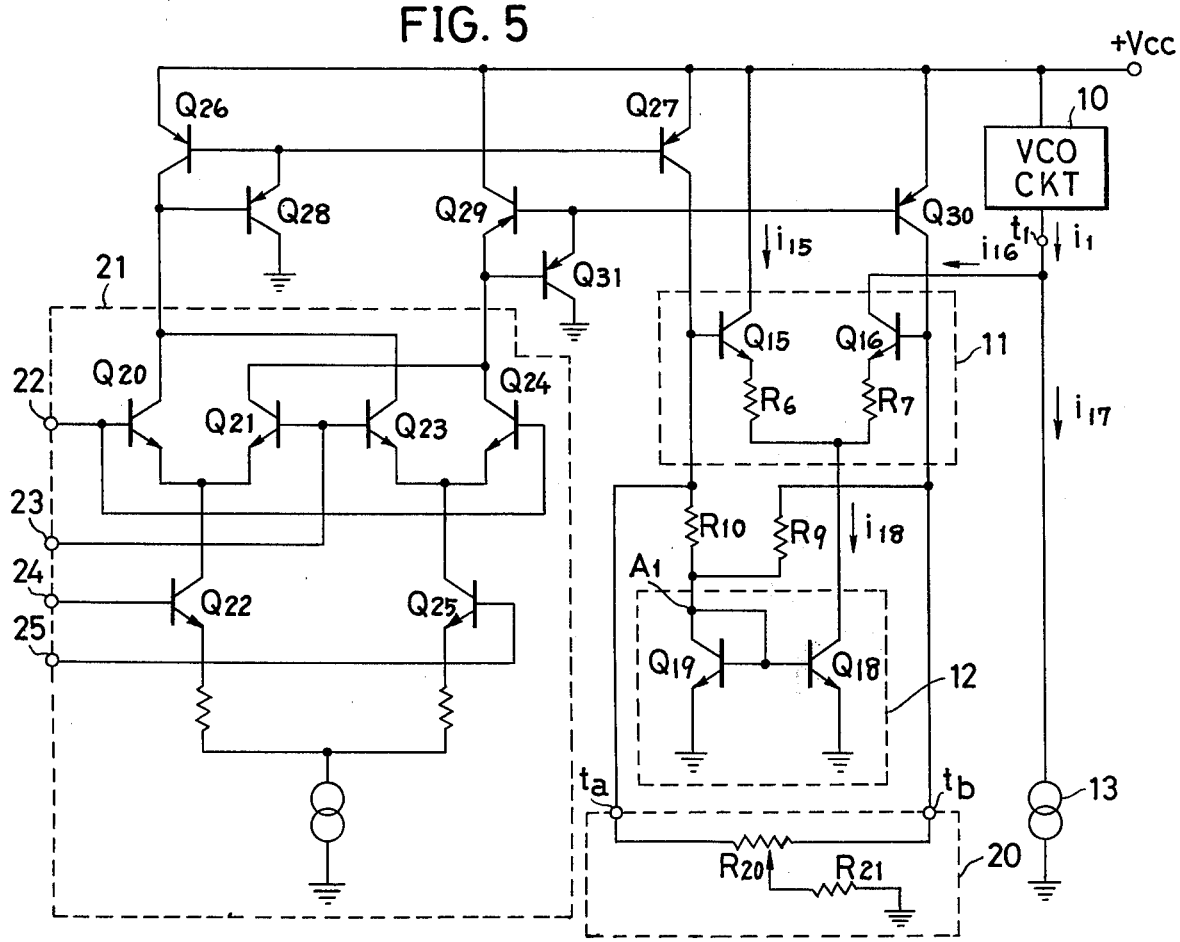
FIG. 5 is a circuit diagram showing one embodiment of a voltage controlled oscillator according to the invention.

The present invention, based on this point, will now be described with respect to one embodiment shown in FIG. 5. In FIG. 5, parts which are equivalent to corresponding parts in FIG. 1 are designated by like reference numerals and characters, and a detailed description thereof will not be repeated.

A characteristic feature of this embodiment is that a frequency adjusting circuit 20 is connected to the terminals ta and tb. Here, a variable resistor R20 is connected across the terminals ta and tb, and a resistor R21 is connected between the sliding contact of variable resistor R20 and ground (earth).

A phase comparator 21, in a PLL, comprises transistors Q20 through Q25. The output signal from the voltage controlled oscillator 10 is supplied across a terminal 22 (connected to the bases of the transistors Q20 and Q24) and a terminal 23 (connected to the bases of the transistors Q21 and Q23). Furthermore, an angle modulated wave signal is supplied across a terminal 24 connected to the base of the transistor Q22 and a terminal 25 connected to the base of the transistor Q25.

The phase comparator 21 compares the phase of the output signal from the above mentioned voltage controlled oscillator 10 and the phase of the carrier wave of the angle modulated wave. The compared output error voltage is produced as the resulting output and is passed from the collectors of the transistors Q20 and Q23 and the transistors Q21 and Q24, and through current mirror circuits comprising transistors Q26 through Q28 and transistors Q29 through Q31. The error voltage is applied on the bases of the transistors Q15 and Q16 of the differential amplifier circuit 11.

Then, the current does no deviate even when the voltage applied on the bases of the transistors Q15 and Q16 is zero. Moreover the sliding contact of the variable resistor R20 is at its midpoint position. Even if the circuit is in the form of an integrated circuit (IC), the currents $i18$ and $i17$ do not deviate very much, but the deviation of the current $i10$ is great. The reason for this is that asymmetrical currents generated within the phase comparator 21 and/or the constant-current circuit 12 cause differences in the base potentials of the transistors Q15 and Q16 of the differential amplifier circuit 11. Furthermore, a current difference of the asymmetrical currents is amplified by this differential amplifier 11.

Accordingly, in the circuit of the present invention, it is possible to move the sliding contact of the variable resistor R20, and thereby vary the resistance value thereof, to adjust the lock range of the PLL and make it symmetrical.

More specifically, when the sliding contact of the variable resistor 20 is moved from its midpoint position to the side of the terminal $tb$, for example, the base potential of the transistor Q16 becomes less than the base potential of the transistor Q15. Consequently, the collector current $i16$ of the transistor Q16 decreases. Since the aforementioned current $i17$ is substantially constant, the control current $i1$ ($= i16 = i17$) of the voltage controlled oscillator 10 also decreases. As a result, the oscillation frequency of the voltage controlled oscillator 10 varies toward a lower value.

On the other hand, when the sliding contact of the variable resistor R20 is moved from its midpoint position toward the side of the terminal $ta$, the above described results are reversed. That is, the current $i16$ increases, and the control current $i1$ also increases. The frequency of the voltage controlled oscillator 10 varies toward a higher value.

By equalizing the base potentials of the transistors Q15 and Q16 and by adjusting the resistance value of the variable resistor R20 in this manner, it is possible to correct a deviation of the free-running oscillation frequency of the voltage controlled oscillator 10, which deviation arises from a difference between the base potentials of the transistors Q15 and Q16.

After adjustment in this manner, the collector current $i16$ of the transistor Q16 can be varied from zero to $i18$, in accordance with the output voltage of the phase comparator 21. Accordingly, as described hereinbefore, a symmetrical lock range characteristic of the PLL can be obtained since the current $i1$ vaires within a range from $k.i18$ to $(k + 1)i18$ with $(k + 1/2).i18$ as a center frequency.

While the present disclosure uses terms such as "voltage controlled oscillator", and "voltage controlled oscillator circuit part", they are intended to also cover and include terms such as "current controlled oscillator" and "current controlled oscillator circuit part". Thus expressed, the oscillation frequencies therein are controlled by currents.

Further, this invention is not limited to these embodiments but various variations and modifications may be made without departing from the scope of the invention.

What is claimed is:

1. A voltage controlled oscillator circuit comprising: a voltage controlled oscillator means for generating a signal having a frequency which is proportional to an input control current; a first constant-current circuit means for producing a first constant current; current dividing means having a pair of points to which a control voltage is applied from the outside, said dividing means dividing said first constant current in accordance with the control voltage; a second constant-current circuit means for producing a second constant current; means for supplying a current which is equal to the sum of one part of said divided current and said second constant current, said sum current forming said input control current to said voltage controlled oscillator; and adjusting means for adjustably varying said control voltage, whereby the output current of said current dividing means is adjusted, and the free-running oscillation frequency of said voltage controlled oscillator is adjusted.

2. A voltage controlled oscillator circuit as claimed in claim 1 in which said current dividing means comprises a differential amplifier including a pair of transistors the bases of which are respectively connected to said pair of points.

3. A voltage controlled oscillator circuit as claimed in claim 1 in which said adjusting means comprises a variable resistor having two terminals respectively connected to said pair of points and to a sliding contact which is connected to ground.

4. A voltage controlled oscillator circuit as claimed in claim 1 and a phase locked loop having a phase comparator in which said pair of points receives a compared error signal which is produced as output by said phase comparator, means for operating said phase comparator responsive to an oscillation output signal of said voltage controlled oscillator and responsive to an angle modulated wave signal, to thereby compare phases and produce said compared error signal.

5. A voltage controlled oscillator circuit as claimed in claim 2 in which said first constant-current circuit comprises a current mirror circuit having two output terminals with equal currents flowing therethrough, one of said output terminals being connected to said current dividing means, the other output terminal being connected respectively through resistance elements to the bases of a pair of transistors of said differential amplifier.

6. A voltage controlled oscillator circuit as claimed in claim 3 in which the sliding contact of said variable resistor is grounded through a resistance element.

* * * * *